United States Patent [19]
Nunotani et al.

[11] Patent Number: 5,346,555
[45] Date of Patent: Sep. 13, 1994

[54] DEVICE FOR THERMAL TREATMENT AND FILM FORMING PROCESS

[75] Inventors: Shinji Nunotani; Koichi Takahashi; Naoto Miyashita, all of Kanagawa, Japan

[73] Assignee: Kabushiki Kaisha Toshiba, Kawasaki, Japan

[21] Appl. No.: 98,097

[22] Filed: Jul. 28, 1993

[30] Foreign Application Priority Data

Jul. 30, 1992 [JP] Japan .................. 4-203842

[51] Int. Cl.⁵ .............................. C23C 16/00
[52] U.S. Cl. .................. 118/724; 118/715; 118/725; 219/405; 219/411
[58] Field of Search ............ 118/715, 724, 725; 219/405, 411

[56] References Cited

U.S. PATENT DOCUMENTS 3,862,397  1/1975  Anderson et al. .............. 219/405
5,160,545  11/1992  Maloney et al. ................ 118/724

FOREIGN PATENT DOCUMENTS 0176223  9/1985  Japan .................. 118/724
3224217  10/1991  Japan .................. 118/724

Primary Examiner—R. Bruce Breneman
Assistant Examiner—Ramamohan Rao Paladugu
Attorney, Agent, or Firm—Foley & Lardner

[57] ABSTRACT

A device for a thermal treatment process and a film forming process includes a chamber for forming a thin-film on a semiconductor substrate under high temperatures, a heater positioned to enclose the outer periphery of the chamber, for heating the inside of the chamber to a high temperature; and insulator positioned to enclose the outer periphery of the heater. The device further has a first space formed between the chamber and the heater, a second space formed between the heater and the insulator, first and second exhaust sections provided for exhausting air from the first and second spaces. In the device, prior to inserting the semiconductor substrate into and removing the semiconductor substrate from the chamber, high temperature air is exhausted from the first and second spaces by the first and second exhaust sections, respectively, to cool inside of the chamber.

6 Claims, 4 Drawing Sheets

DEVICE FOR THERMAL TREATMENT AND FILM FORMING PROCESS

TECHNICAL FIELD

The present invention relates to a device for a thermal treatment process and a film forming process for fabricating a film or a thin-film on a semiconductor substrate such as a wafer during fabrication processes of a semiconductor device, and, in particular, to a device for a thermal treatment process and a film forming process wherein temperature inside a chamber in which a thin-film is formed can be rapidly reduced.

BACKGROUND ART

In general, thin-film fabricating processes are ordinarily used in order to form thin-films such as a polysilicon film, an oxide film, and a nitride film on a semiconductor substrate in a semiconductor device by using the device for a thermal treatment process and a film forming process and a chemical vapor deposition (CVD) device, for example. After completion of the processes these thin-films formed on the semiconductor substrate become components of the semiconductor device.

In general, the degree of cleanliness of the surfaces of a semiconductor substrate before forming of thin-films thereon greatly affects features and reliability of the semiconductor device.

In order to eliminate minor effects of the poor degree of cleanliness of the semiconductor substrate, many kinds of wafer and semiconductor substrate cleaning processes are executed before a thin film forming process or among thin-film forming processes.

However, in a conventional device for a thermal treatment process and a thin-film forming process, oxidative reaction is often happened on a semiconductor substrate when the semiconductor substrate is inserted to and removed from a chamber in a device for a thermal treatment process and a thin-film forming process or a chemical vapor deposition (CVD) device because the chamber is at a very high temperature.

The oxide film formed on a semiconductor substrate reduces the characteristic of the semiconductor device and reliability thereof. This is a problem.

FIG. 1 shows a configuration of a conventional device for thermal treatment and a thin-film fabricating process. As shown in FIG. 1, a heater 103 is adhered on a chamber 101 in the conventional device to heat the chamber 101 as a thermal treatment. In addition, in order to keep a constant temperature in the chamber, an insulator 105 as a temperature keeping material is adhered on the heater 103 to cover the chamber 101.

As clearing shown in FIG. 1, there is no cooling device to cool the heater 103 in a conventional device for a thermal treatment and a thin-film forming process.

Accordingly, the conventional device for a thermal treatment process and a thin-film forming process is only provided with means for lowering the temperature within the film-forming process chamber 101 consisting of a cooling process relying on natural heat dissipation, for preventing an oxidation reaction caused by heating.

Specifically, the temperature of the heater 103 and the temperature in the film-forming process chamber 101 are almost equivalent because of the above-described structure of the conventional film-forming chamber.

Even when it is desired to cool the inside of the film-forming chamber 101, there is no function provided to cool the heater 103 itself.

It is therefore necessary to rely on cutting the power to the heater 103 and allowing natural dissipation of the heat. Considerable time is therefore required to attain the desired lowering of the temperature in the film-forming chamber 101.

To explain the above-mentioned drawback of the conventional deice used for a thermal treatment process and a thin-film forming process in more detail, the temperature of the heater 103 after a thin-film is formed on the semiconductor substrate conventionally decreases at a cooling rate of about 2° C. per minute to reach a temperature at which a natural oxide film will not grow, so that the next thin-film can be formed. Therefore, for example, about 100 minutes elapses in cooling 200° C. from 600° C. to 400° C.

This cooling time is equivalent to or greater than the time required in the original processing, for example, lowering the pressure after setting a wafer, forming a film, returning to normal pressure, and resetting a wafer. When this amount of time is used simply to lower the temperature, there is an increase in the amount of wasted time not directly related to production, resulting in a major drop in productivity.

For this reason, it frequently happens that the wafer is normally set in the film-forming chamber 101 at the processing temperature, without decreasing the temperature in the film-forming chamber 101. Therefore, even when the oxide film naturally formed on the surface of the silicon is removed prior to processing, air penetrating the surface of the wafer as a result of air entering the chamber during the insertion of the wafer promotes an oxidation reaction as a result of the high temperature inside the film-forming chamber.

A thin oxide film therefore grows before a film of polysilicon or the like is formed. Under such conditions, when an emitter section of a transistor is formed from a polysilicon film, this natural oxide film acts as a barrier, inhibiting the diffusion of impurities throughout the silicon, so that the device has high emitter resistance.

However, recent progress has been made in the miniaturization of such devices, and, when the size of the emitter region is reduced, it is necessary to hold the emitter resistance to a low level. This type of phenomenon by which an oxide film is formed is therefore inconvenient.

In addition, during maintenance of the device for the thermal treatment process and the film forming process, it takes about half a day to cool the device to room temperature in order to wash tubes in the device. Processing must therefore be halted during this period, and this hinders productivity.

SUMMARY OF THE INVENTION

Accordingly, an object of the present invention is, with due consideration to the drawbacks of such conventional devices, to provide a device for a thermal treatment process and a film forming process wherein there is no drop in productivity, and wherein it is possible to prevent the growth of a natural oxide film on a semiconductor substrate during the formation of a thin-film.

In accordance with a first aspect of the invention, a device for a thermal treatment process and a film forming process comprises:

a film forming process chamber for forming a film on a semiconductor substrate under high temperatures;

heating means, positioned to enclose the outer periphery of said film forming process chamber, for heating the inside of said film forming process chamber to a high temperature; and insulating means positioned to enclose the outer periphery of said heating means;

a first space is formed between said film forming process chamber and said heating means;

a second space is formed between said heating means and said insulating member;

first exhaust means is provided for exhausting air from within said first space; and second exhaust means is provided for exhausting air from within said second space, wherein prior to inserting the semiconductor substrate into and removing the semiconductor substrate from said film forming process chamber, high temperature air is exhausted from said first space and said second space by said first exhaust means and said second exhaust means, respectively, in order to cool inside of said film forming process chamber.

In accordance with another aspect of the present invention, a device for a thermal treatment process and a film forming process described above, wherein an air inlet port and an air outlet port are each provided for said first space and said second space, said air inlet port and said air outlet port are each provided with a movable shutter, said movable shutter is open only during the cooling of the inside of said film forming process chamber, and the high temperature air within said first space and said second space is exhausted using said first exhaust means and said second exhaust means.

In accordance with another aspect of the present invention, a device for a thermal treatment process and a film forming process described above, further comprises first cooling means and second cooling means, wherein the heated air in said first space and said second space to be exhausted by said first exhaust means and said second exhaust means is cooled by said first cooling means and said second cooling means, respectively, before exhausting the heated air to outside of said device.

In accordance with another aspect of the present invention, a device for a thermal treatment process and a film forming process described above, further comprises: a first blower between said film forming process chamber and said first cooling means; and a second blower located between said film forming process chamber and said second cooling means. In the device the heated air in said first space and said second space is forced during cooling of said film forming process chamber.

In accordance with another aspect of the present invention, in the device for a thermal treatment process and a film forming process described above, said first space and said second space are filled with water or nitrogen gas to cool said film forming process chamber.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

First, basic features of the present invention will be explained briefly and then describe detailed embodiments of the present invention.

In a device for a thermal process and a film forming process of the present invention, prior to inserting or removing a semiconductor substrate, the high temperature air is exhausted from first and second spaces located in the device and it is possible to reduce the temperature within a film forming process chamber in the device at a cooling rate of 10° C. per minute or greater by air-cooling.

It is therefore possible to perform the specified temperature reduction at a rate at least five times as great as in a conventional device for a thermal treatment process and a film forming process, making it possible to insert a new semiconductor substrate within a short time. Accordingly, it is possible to prevent the growth of a natural oxide film on the semiconductor substrate with no loss of productivity.

Next, an explanation of a device for a thermal treatment process and a film forming process according to a first embodiment of the present invention will now be given with reference to the drawings.

Figure 1:
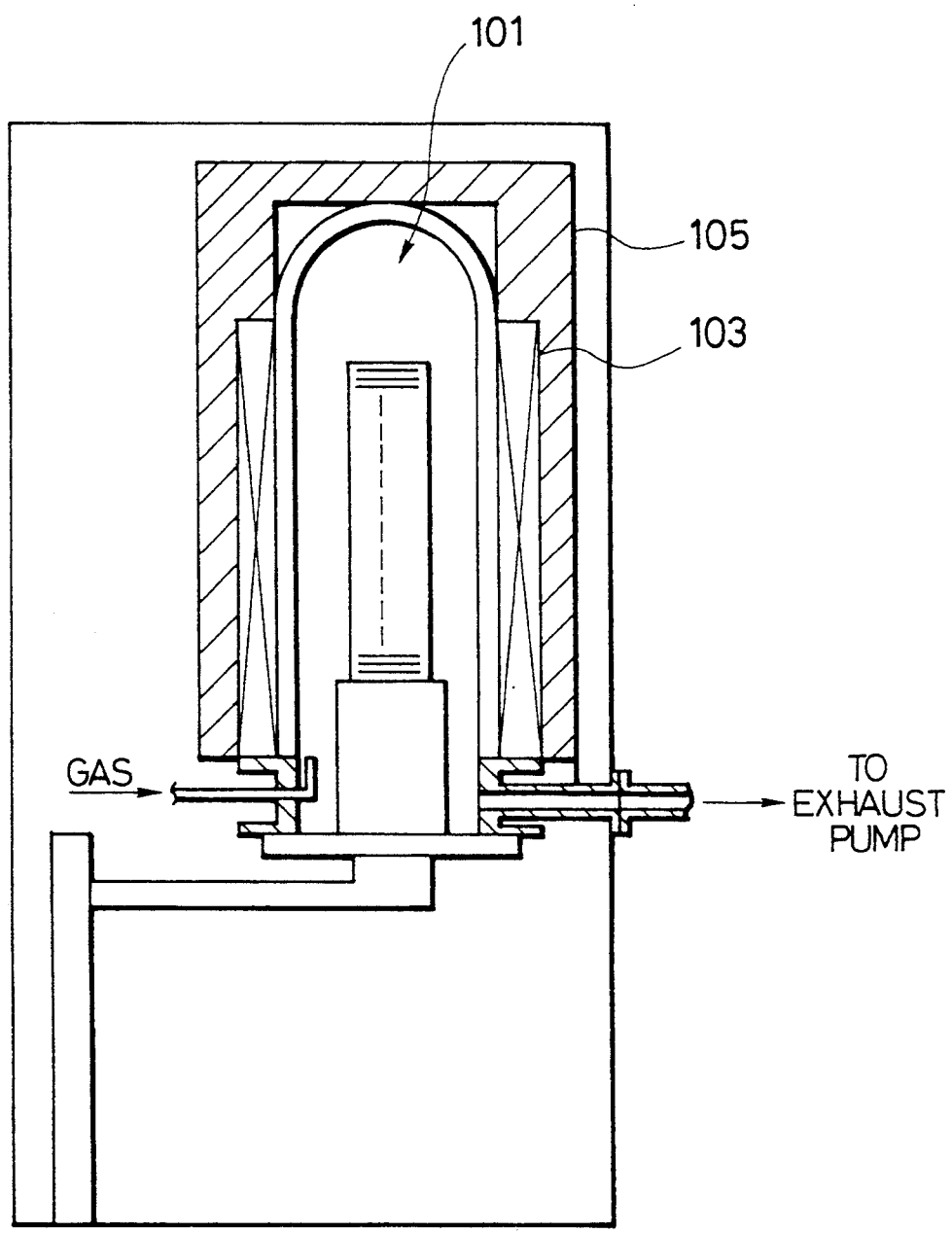
FIG. 1 is a configuration drawing of a conventional device for a thermal treatment process and a film forming process according to the present invention.
Figure 2:
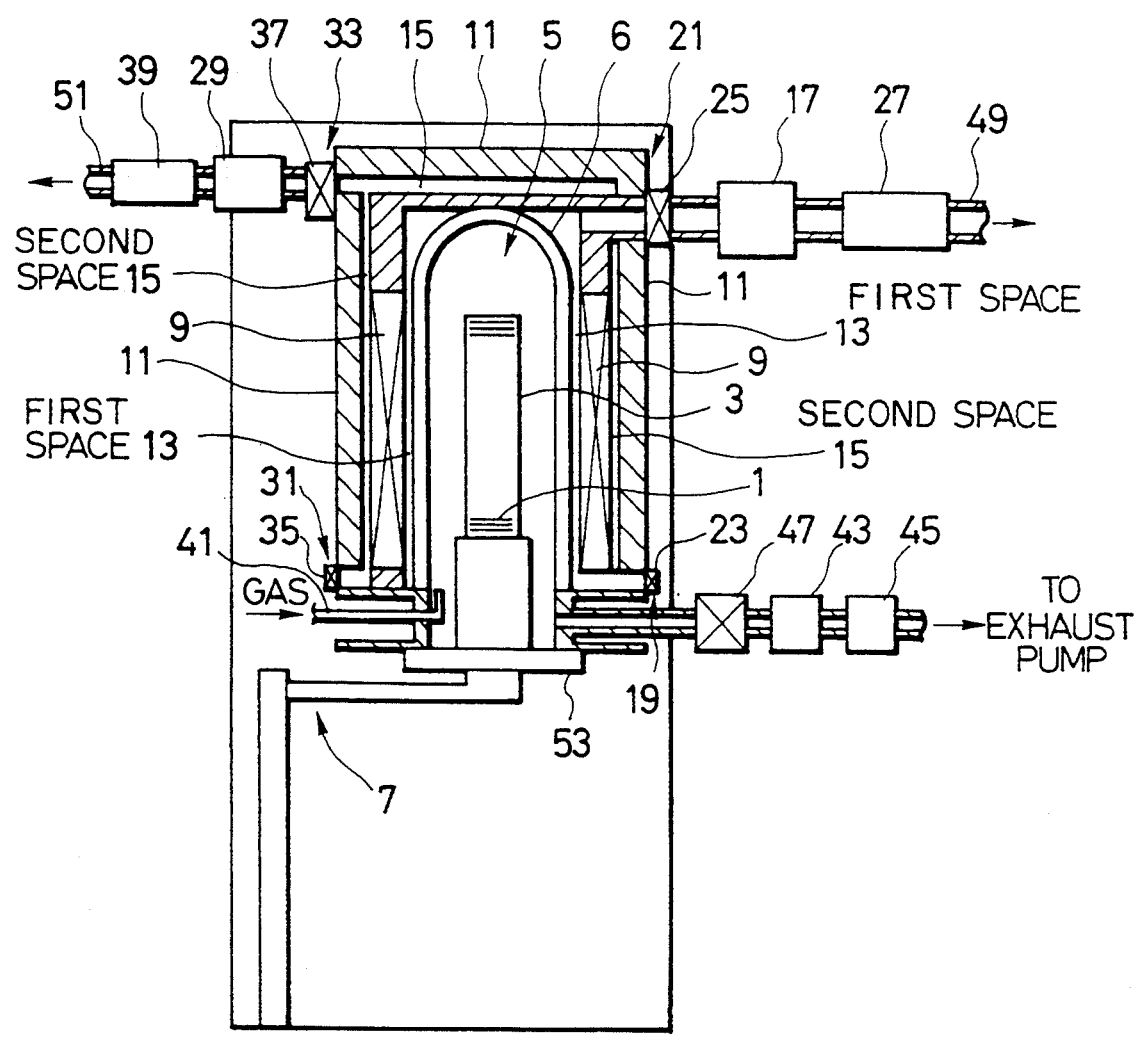
FIG. 2 is a configuration drawing of an embodiment of a device for a thermal treatment process and a film forming process according to the present invention.

FIG. 2 is a configuration drawing of a first embodiment of a device for a thermal treatment and a film forming process according to the present invention.

The device for the thermal treatment process and the film forming process shown in FIG. 2 is a low pressure chemical vapor deposition (LP-CVD) device for forming a polysilicon film under reduced pressure. The device comprises: a board 3 on which a semiconductor substrate 1 is loaded; a film forming process chamber 5 for forming a thin-film on the semiconductor substrate 1 at a high temperature; an elevator mechanism 7 for inserting and removing the board 3, on which the semiconductor substrate 1 is loaded, into and from the film-forming process chamber 5; a heater 9 positioned to enclose the side section of an outer wall 6 of the film-forming process chamber 5 for heating the inside of the film-forming process chamber 5 to a high temperature; an insulating member 11 positioned to enclose the periphery of the heater 9 and the upper section of the outer wall 6 of the film forming process chamber 5.

In addition the device further comprises: a first space 13 formed between the outer wall 6 of the film forming process chamber 5 and the heater 9; a second space 15 formed between the heater 9 and the insulating member 11; a first fan 17 for drawing hot air from inside the first space 13; a first shutter 23 and a second shutter 25 for opening and closing an air inlet port 19 and an air outlet port 21 in the first space 13, corresponding to the operation of the first fan 17; a first radiator 17 for cooling the hot air exhausted by the first fan 17; a second fan 29 for drawing hot air from inside the second space 15; a third shutter 35 and a fourth shutter 37 for opening and closing an air inlet port 31 and an air outlet port 33 in the second space 15, corresponding to the operation of the second fan 29; and a second radiator 39 for cooling the hot air exhausted by the second fan 29.

The device for the thermal treatment process and the film forming process further comprises: a gas nozzle 41 for introducing a reactive gas into the film-forming process chamber 5; a pair of vacuum pumps 43 and 45 for drawing a vacuum in the film-forming process chamber 5; and a gate valve 47 for opening and closing a duct between the pump 43 and the film-forming process chamber 5.

In addition, the board 3 is loaded onto a furnace flange 53 provided for covering a semiconductor substrate insertion and removal port in the film-forming process chamber 5.

Also, the opening and closing operation of the first, second, third, and fourth shutters 23, 25, 35, 37; and the operation of the first and second fans 17, 29; and the operation of the first and second radiators 27, 39; are automatically controlled by a controller such as a process controller (not shown in FIG. 2), linked to the operation of the elevator mechanism 7 which will be later described, and to the operation of the vacuum pumps 43, 45 by means of a control section which has been omitted from the drawing.

Next, the operation of the device for the thermal treatment process and the film forming process of the above-described structure will be explained.

A method for forming a polysilicon film will be explained here as an example.

First, the semiconductor substrate 1 is loaded onto the board 3 which is set on the furnace throat flange 53. The board 3 is elevated by the elevator mechanism 7 to the middle of the film forming process chamber 5 which is at a specified low temperature of 300° C. at which a natural oxide film will not grow, as will be later explained, and the film forming process chamber 5 is sealed by the furnace throat flange 53.

Next, the heater 9 is turned on, and the film forming process chamber 5 is heated at a rate of 10° C. per minute or greater. Accordingly, the first and second shutters 23, 25 provided in the air inlet port 19 and the air outlet port 21 of the first space 13, and the third and fourth shutters 35, 37 provided in the air inlet port 31 and the air outlet port 33 of the second space 15 are completely closed so that convection currents caused by heating do not occur in the first and second spaces 13 and 15, resulting in good heating efficiency.

Simultaneously, the vacuum pumps 43 and 45 are operated so that air is exhausted from the film forming process chamber 5.

Following this, the conditions are stabilized at the film forming temperature for polysilicon (the deposition temperature) under vacuum, and the film is then formed at the film forming pressure (10 to 20 Pa). Silane gas flowing from the reactive gas nozzle 41 is provided as the gas when the film is formed in this case, using a commonly known method.

After the film is formed, when the first and second shutters 23, 25 and the third and fourth shutters 35, 37 are opened, the first and second fans 17, 29 are operated so that heated air in the first space 13 between the outer wall 6 of the film-forming process chamber 5 and the heater 9, and in the second space 15 between the heater 9 and the insulating member 11 is drawn out through the air outlet ports 21, 33.

Outside air at a low temperature flows through the air inlet ports 19, 31 into the first and second spaces 13, 15, so that the temperature of the heater 9 and of the film-forming process chamber 5 is reduced at a rate of 10° C. per minute or greater by air-cooling. Simultaneously with this air-cooling, the pressure in the film forming process chamber 5 is reduced and the chamber is purged with nitrogen gas.

The high temperature air drawn out by the first and second fans 17, 29 is thoroughly cooled by the first and second radiators 27, 39 and is exhausted from a pair of exhaust ducts 49, 51 so that heated air is not released as is into a clean room.

The temperature in the film forming process chamber 5 is then reduced to a specified low temperature at which a natural oxide film will not grow. The pressure in the film forming process chamber 5 is increased to atmospheric pressure, the first and second shutters 23, 25, the third and fourth shutters 35, 37 are closed, and the first and second fans 17, 29 are halted.

Simultaneously, the furnace throat flange 53 is lowered by the elevator mechanism 7 and the semiconductor substrate 1 is removed from the film-forming process chamber 5, thus completing one sequence of the film-forming operation.

This film forming operation is then repeated to continue forming polysilicon films.

In the above film-forming operation it is possible to reduce the temperature within the film-forming process chamber 5 at a cooling rate of 10° C. per minute or greater, thereby performing the specified temperature reduction at a rate at least five times as great as in a conventional device for the thermal treatment process and the film forming process, thus making it possible to insert a new semiconductor substrate within a short period.

Accordingly, it is possible to prevent the natural growth of a oxide film on the semiconductor substrate, with no loss of productivity.

An explanation of a second embodiment of the present invention will now be given with reference to the drawings.

Figure 3:
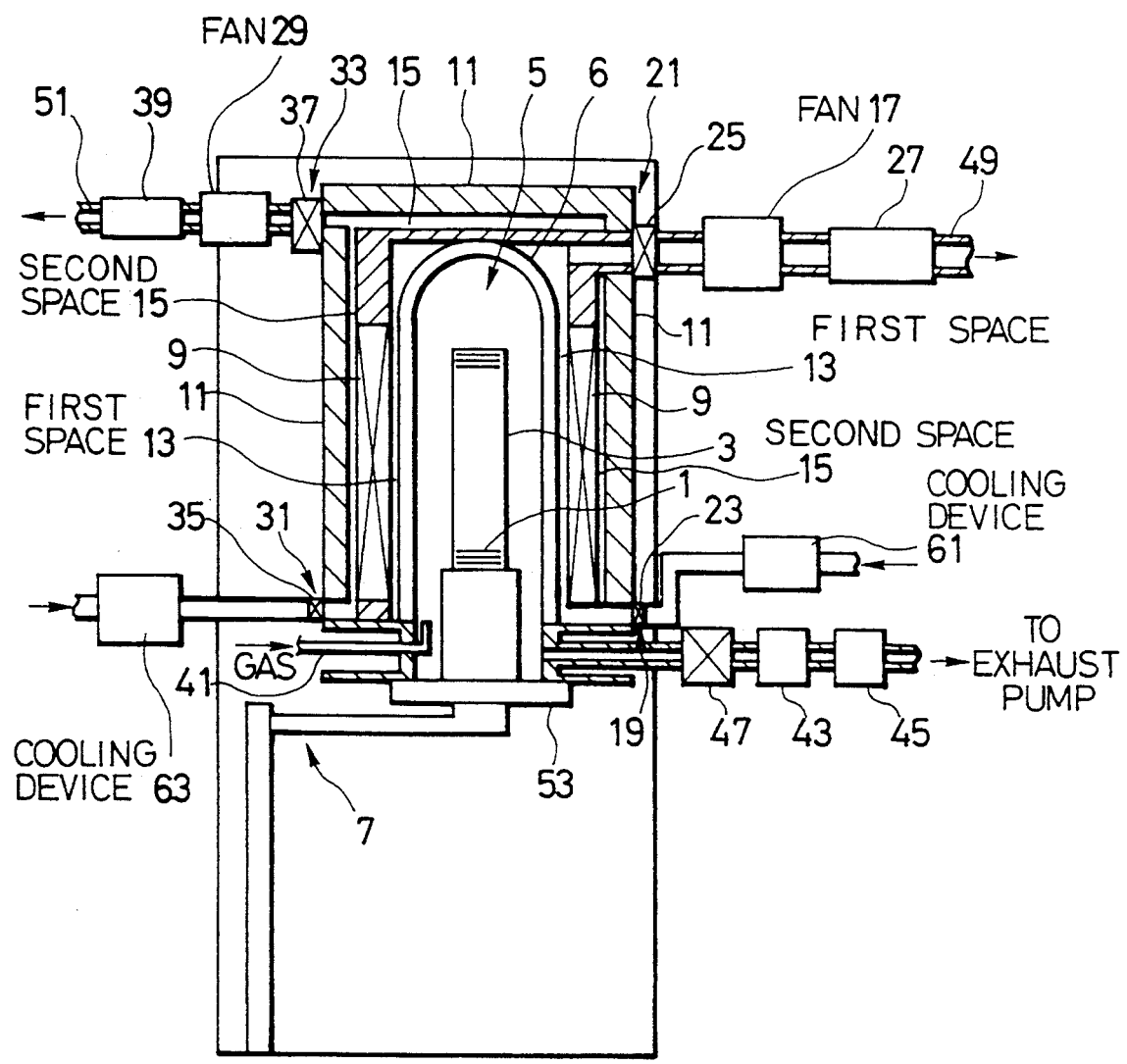
FIG. 3 is a configuration drawing of another embodiment of a device for a thermal treatment process and a film forming process according to the present invention.

FIG. 3 is a configuration drawing of a second embodiment of a device for a thermal treatment process and a film forming process according to the present invention.

As illustrated in FIG. 3, this second embodiment comprises a first cooling device 61 for cooling air flowing from the air inlet port 19 into the first space 13, as in the first embodiment, to a temperature lower than the temperature in the process chamber; and a second cooling device 63 for cooling air flowing from the air inlet port 31 of the second space 15 to a temperature lower than the temperature in the process chamber.

Like reference numerals have been used to designate structural elements which are identical or correspond to those in the first embodiment, therefore further detailed explanation has been omitted.

By means of this second embodiment, the air introduced into the first and second spaces 13 and 15 is cooled to a temperature lower than that in the process chamber, therefore the rate of cooling the inside of the film-forming process chamber 5 prior to inserting or removing a semiconductor substrate is further improved.

Furthermore, in the first and second embodiments the fans 17 and 29 are provided at the sides of the air outlet ports 21, 33 for the first and second spaces 13, 15.

Figure 4:
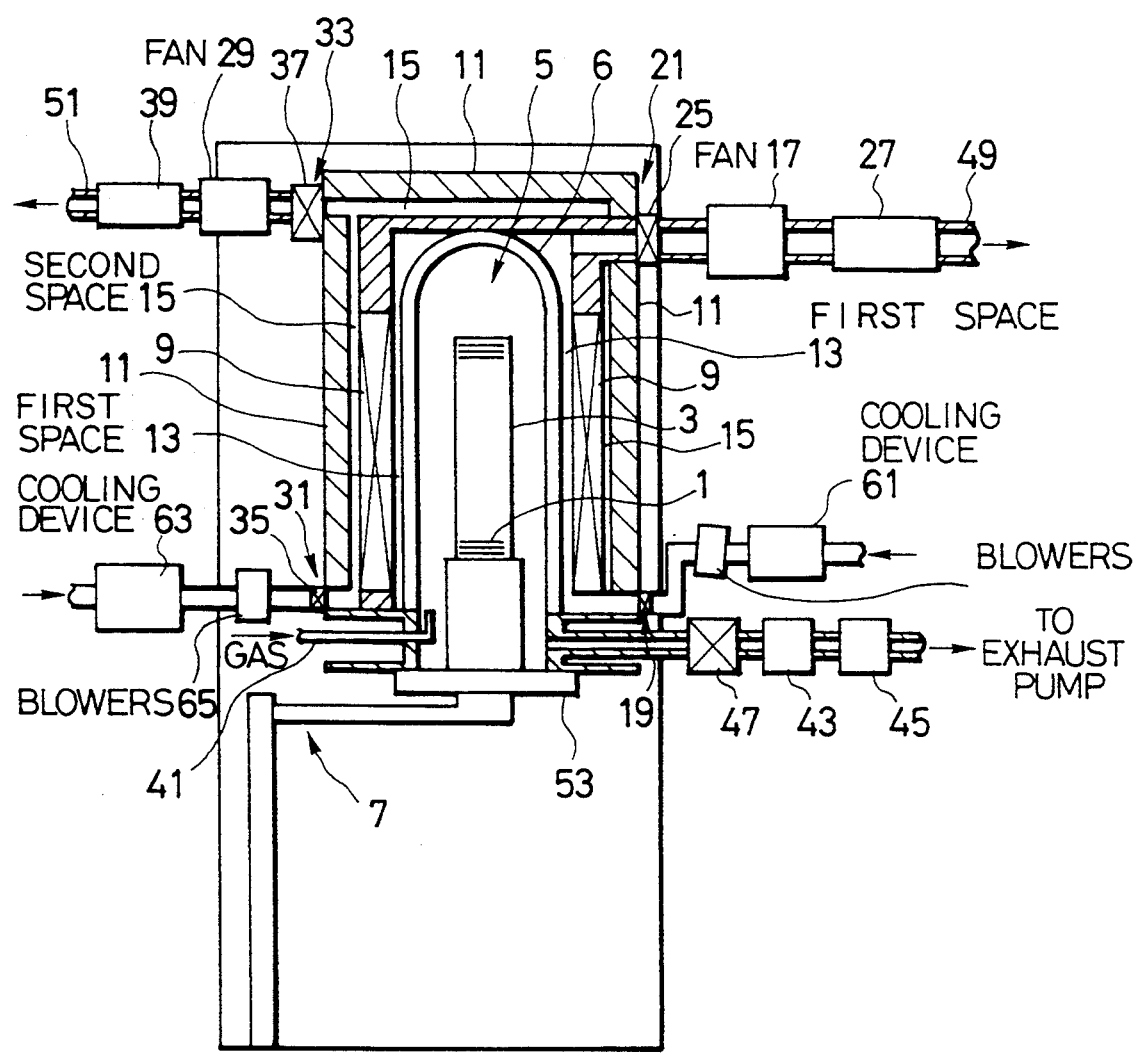
FIG. 4 is a configuration drawing of another embodiment of a device for a thermal treatment process and a film forming process according to the present invention.

However, as shown in FIG. 4, it is also possible to provide blowers 64 and 65 at the sides of the air inlet ports 19, 31 so that forced air can be fed into the first and second spaces 13, 15 during cooling so that the rate of cooling can be increased.

In addition, in the foregoing embodiments air is used for cooling, but it is also possible to cool using an inert gas such as nitrogen or the like.

Cooling by means of chilled water or another liquid passed into the first and second spaces 13, 15 is also possible.

The device for the thermal treatment process and the film forming process according to the present invention does not necessarily have to be a device for forming a CVD film.

Alleviation of heat stress in the wafer generated by oxidation process and diffusion process can also be used.

A vertical device for the thermal treatment process and the film forming process has been described as an example of the foregoing embodiments, but a horizontal model is, of course, also appropriate.

As explained above, because the device for the thermal treatment process and the film forming process of the present invention has the structure described above, it is possible to reduce the temperature within the film-forming process chamber at a cooling rate of 10° C. per minute or greater. Therefore, only a short time is required to cool to a temperature at which a natural oxide film will not grow, prior to inserting or removing the semiconductor substrate. For example, only 20 minutes or less is required to cool from 600° C. to 400° C. This amount of time is the same as the amount of time required to return to atmospheric pressure from reduced pressure conditions in the film-forming process chamber after depositing a polysilicon film or the like. Cooling is completed within this time so that there is no drop in productivity, and the oxide film which grows naturally during the time it takes to insert the semiconductor substrate can be inhibited.

For this reason, by use of the present invention, when forming an emitter region in a semiconductor device on which a polysilicon film is grown, very little oxide film is naturally formed between the silicon and polysilicon films.

A semiconductor device with a low emitter resistance can therefore be formed.

In addition, as a secondary effect, the device stop down time for heating and cooling when washing the film forming process chamber is also very small, and the production efficiency of the device can also be increased.

What is claimed is:

1. A device for a thermal treatment process and a film forming process comprising:
    a film forming process chamber for forming a film on a semiconductor substrate under high temperatures;
    heating means, positioned to enclose the outer periphery of said film forming process chamber, for heating the inside of said film forming process chamber to a high temperature; and
    insulating means positioned to enclose the outer periphery of said heating means;
    a first space is formed between said film forming process chamber and said heating means;
    a second space is formed between said heating means and said insulating member, said first space being isolated from said second space;
    first exhaust means is provided for exhausting air from within said first space; and
    second exhaust means is provided for exhausting air from within said second space,
    wherein
    prior to inserting the semiconductor substrate into and removing the semiconductor substrate from said film forming process chamber, high temperature air is exhausted from said first space and said second space by said first exhaust means and said second exhaust means, respectively, in order to cool inside of said film forming process chamber.

2. A device for a thermal treatment process and a film forming process as claimed in claim 1,
    wherein
    an air inlet port and an air outlet port are each provided for said first space and said second space, said air inlet port and said air outlet port are each provided with a movable shutter, said movable shutter is open only during the cooling of the inside of said film forming process chamber, and the high temperature air within said first space and said second space is exhausted using said first exhaust means and said second exhaust means.

3. A device for a thermal treatment process and a film forming process as claimed in claim 1, further comprises first cooling means and second cooling means,
    wherein the heated air in said first space and said second space to be exhausted by said first exhaust means and said second exhaust means is cooled by said first cooling means and said second cooling means, respectively, before exhausting the heated air to outside of said device.

4. A device for a thermal treatment process and a film forming process as claimed in claim 3, further comprises:
    a first blower between said film forming process chamber and said first cooling means; and
    a second blower located between said film forming process chamber and said second cooling means,
    wherein the heated air in said first space and said second space is forced during cooling of said film forming process chamber.

5. A device for a thermal treatment process and a film forming process as claimed in claim 1, said first space and said second space are filled with water to cool said film forming process chamber.

6. A device for a thermal treatment process and a film forming process as claimed in claim 1, said first space and said second space are filled with nitrogen gas to cool said film forming process chamber.

* * * * *